United States Patent [19]

Takafuji et al.

[11] 4,425,572
[45] Jan. 10, 1984

[54] THIN FILM TRANSISTOR

[75] Inventors: Yutaka Takafuji; Keisaku Nonomura, both of Nara; Sadatoshi Takechi, Tenri; Tomio Wada, Nara, all of Japan

[73] Assignees: Sharp Kabushiki Kaisha; Japan Electronic Industry Development Association, both of Osaka, Japan

[21] Appl. No.: 261,545

[22] Filed: May 7, 1981

[30] Foreign Application Priority Data

May 16, 1980 [JP] Japan ................................. 55-65720

[51] Int. Cl.³ ..................... H01L 45/00; H01L 29/78; H01L 23/48
[52] U.S. Cl. ......................................... 357/4; 357/23; 357/68
[58] Field of Search .............. 357/4, 68, 23 TF, 23 D, 357/23 GP, 23 I, 23 R

[56]  References Cited
U.S. PATENT DOCUMENTS 3,616,527  11/1971  Janning ................. 357/4 X
3,710,205  1/1973   Swanson ................ 357/23 TF X
4,172,260  10/1979  Okabe et al. .......... 357/23 HV
4,332,075  6/1982   Ota et al. ............. 29/571

FOREIGN PATENT DOCUMENTS 50105371  3/1977  Japan ................................ 357/23 R
50141653  5/1977  Japan ................................ 357/23 R Primary Examiner—Martin H. Edlow
Assistant Examiner—J. L. Badgett
Attorney, Agent, or Firm—Birch, Stewart, Kolasch & Birch

[57]  ABSTRACT

A thin film transistor comprising a substrate having source and drain electrodes formed thereon, a semiconductor layer making contact in part with the source electrode and in part with the drain electrode, a gate electrode, and a gate insulating layer positioned between the semiconductor layer and the gate electrode is disclosed. A portion of the drain electrode is held in overlapping relation to a portion of the gate electrode while a portion of the source electrode is spaced apart from said gate electrode.

4 Claims, 14 Drawing Figures

THIN FILM TRANSISTOR

BACKGROUND OF THE INVENTION

The present invention generally relates to a thin film transistor and, more particularly to a thin film transistor having an improved electrode construction less susceptible to dielectric breakdown.

Typically, four examples of thin film transistors such as shown in FIGS. 1 to 4 of the accompanying drawings, respectively, are well known.

The prior art thin film transistor shown in FIG. 1 comprises an electrically insulating material 1 of glass material having one planar surface formed with a gate electrode 2 formed of any one of Al, Au, Ta, Ni and In by the use of either a masking system for evaporation or a photolithographic technique, a gate insulating layer 3 formed of any one of $Al_2O_3$, SiO, $SiO_2$, $CaF_2$, $Si_3N_4$ and $MgF_2$ by the use of a sputtering technique or a chemical vapor deposition technique so as to overlay the gate electrode 2, a semiconductor layer 4 formed of any one of CdSe, PbS and Te so as to overlay the gate insulating layer 3, and source and drain electrodes 5 and 6 deposited on the assembly in an electrically insulated relation to each other and usually made of such a material, for example, Au, Al, Ni or In, capable of making an ohmic contact with the semiconductor layer 4. In this construction, if the gate electrode is made of either Al or Ta, insulating layer 3 can be formed by the use of a known anodization process.

The thin film transistor shown in FIG. 2 corresponds to that shown in FIG. 1, but for the fact that the semiconductor layer 4 and the combination of the source and drain electrodes 5 and 6 are reversed in position to each other relative to that shown in FIG. 1.

In the thin film transistor shown in FIG. 3, the semiconductor layer 4 and the combination of the source and drain electrodes 5 and 6 are placed on the substrate 1 while the gate electrode 2 is placed on the top of the semiconductor layer 4 with the intervention of the gate insulating layer 3.

The thin film transistor shown in FIG. 4 corresponds to that shown in FIG. 3, but for the fact that the semiconductor layer 4 and the combination of the source and drain electrodes 5 and 6 being are reversed in position to each other relative to that shown in FIG. 3.

In each of the prior art thin film transistors shown respectively in FIGS. 1 to 4, although the gate insulating layer 3 is required to have a thickness as small as possible in order to enable the corresponding transistor to exhibit its favorable performance, the thickness is generally chosen to be within the range of 500 to 1,000 Å for the purpose of avoiding any possible dielectric breakdown of the insulating layer 3.

However, when the prior art thin film transistor of the construction shown in any one of FIGS. 1 to 4 is used as a switching element for driving a matrix type liquid crystal display (not shown), it has been found that problems associated with dielectric breakdown occur. This will be described with reference to FIGS. 5 and 6.

When the source and the gate voltages of respective waveforms shown by (a) and (b) in FIG. 6 are applied to the source electrode 5 and the gate electrode 2 respectively, (Source Voltage: $-10$ Volt, Gate Voltage: $-10$ Volt, Duty Ratio: 1/10) and the voltage (i.e., drain voltage $V_D$) across an equivalent composite capacitance $C_{LC}$ formed by respective capacitances of a segment electrode (not shown) and a storage capacitor both connected between the drain electrode 6 and the ground is such that shown by (c) in FIG. 6, dielectric breakdown of the insulating layer 3 tends to occur because of the reduced thickness of the insulating layer 3. The reason for this is as follows:

The present inventors have conducted a series of experiments with the use of, as a switching element for driving a matrix type liquid crystal display, many samples of thin film transistor of the construction which is shown in FIG. 1 and wherein both the source electrode 5 and the drain electrode 6 overlap the gate electrode 2 in a manner as shown in FIG. 7. When these thin film transistors have operated for a prolonged period of time being having applied the source and gate voltages of the waveforms (a) and (b) in FIG. 6, it has been found that dielectric breakdown of the insulating layer 3 occurred more frequently at a portion sandwiched between the source electrode 5 and the gate electrode 2 than at other portions as evidenced in the following table.

| | Locations Where Dielectric Breakdown Occurred | | |
|---|---|---|---|
| | Overlap between Elements 2 & 5 | Overlap between Elements 2 & 4 | Overlap between Elements 2 & 6 |
| Rate Occurrence | 99.83% | 0.07% | 0.10% |

SUMMARY OF INVENTION

The present invention has been developed with a view to substantially eliminating the above described disadvantages and inconveniences inherent in the prior art thin film transistors and has for its essential object to provide an improved thin film transistor having an electrode construction less susceptible to dielectric breakdown.

According to the present invention, there is provided a thin film transistor wherein the source electrode partially making contact with the semiconductor layer does not overlap the gate electrode deposited on the semiconductor with the insulating layer positioned between the gate electrode and semiconductor layer. By this arrangement, any possible dielectric breakdown of that portion of the insulating layer situated between the source electrode and the gate electrode can advantageously be minimized. Therefore, the thin film transistor of the present invention can operate satisfactorily and stably for a prolonged period of time and accordingly reliable in performance.

BRIEF DESCRIPTION OF THE DRAWINGS

These and other objects and features of the present invention will become apparent from the following description taken in conjunction with preferred embodiments thereof with reference to the accompanying drawings, in which.

DETAILED DESCRIPTION OF EMBODIMENTS

Figure 1:
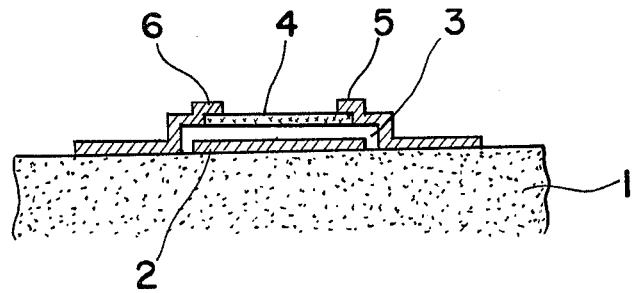
FIGS. 1 to 4 are schematic sectional views of the prior art thin film transistors, respectively.

Before the description of the present invention proceeds, it is to be noted that like parts are designated by like reference numerals throughout the accompanying drawings.

Figure 2:
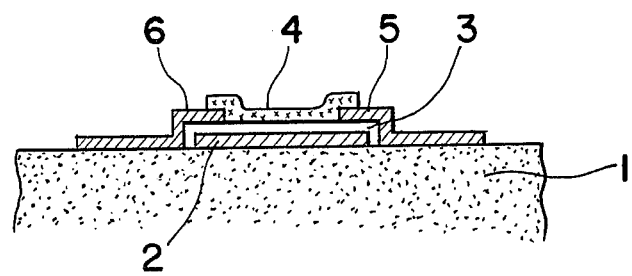
Figure 3:
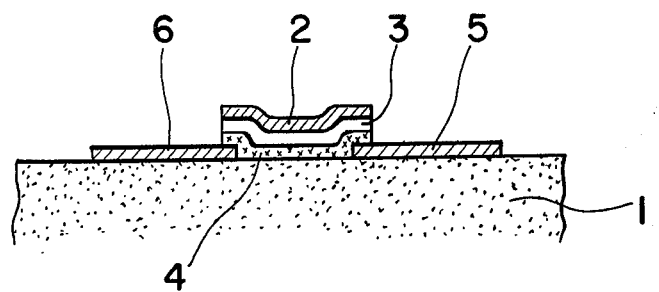
Figure 4:
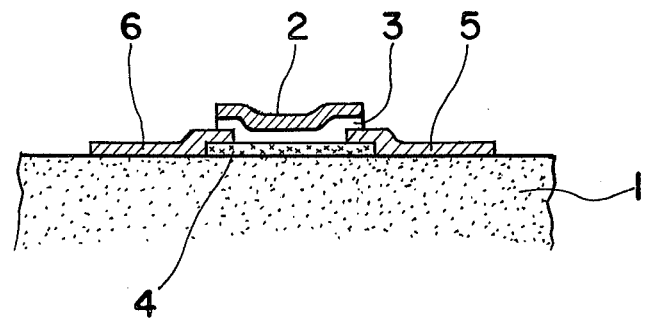
Figure 8:
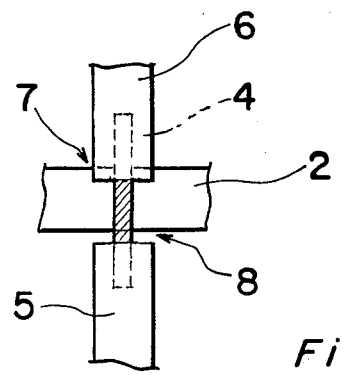
FIG. 8 is a schematic plan view of a thin film transistor according to a first embodiment of the present invention, showing an electrode arrangement.
Figure 13:
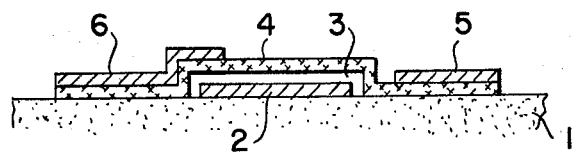
FIG. 13 is a sectional view of the thin film transistor of FIG. 8.

Referring first to FIG. 8 showing a first embodiment of the present invention, the thin film transistor of the construction shown in FIG. 2 is, in accordance with and for the purpose of the present invention, modified so as to give a space or gap 8 between the gate electrode 2 and the source electrode 5 while the gate electrode 2 and the drain electrode 6 remain overlapping at 7 with each other. In the thin film transistor of the construction shown in FIG. 8, Al was used as a material for the gate electrode 2, and the gate insulating layer 3 was formed of a layer, 700 Å in thickness, of $Al_2O_3$ by anodizing the gate electrode 2. In addition, any one of the source electrode 5 and the drain electrode 6 was formed of a layer, 1000 Å in thickness, of Au whereas the semiconductor layer 4 was formed of a layer, 100 Å, of Te. The semiconductor layer 4 was $300\mu$ in channel width, the gate electrode 2 was $600\mu$ in width, and the space 8 between the gate and source electrodes 2 and 5 was $100\mu$. A cross-section of a representative TFT of FIG. 8 on a substrate is represented by FIG. 13.

Figure 5:
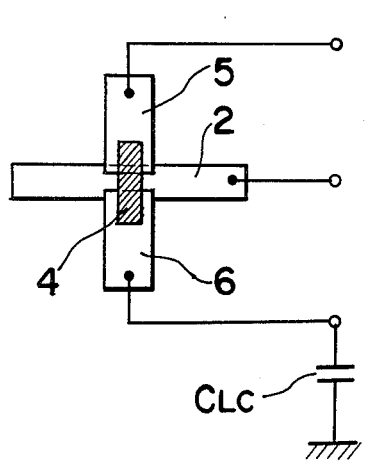
FIG. 5 is a schematic circuit diagram showing the prior art thin film transistor used as a switching element for driving a known liquid crystal display.
Figure 6:
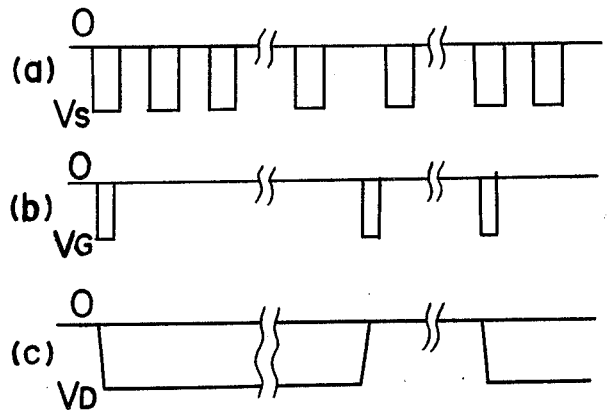
FIG. 6 is a chart showing respective wave forms of voltages at the source, gate and drain electrodes of a thin film transistor when used as the switching element shown in FIG. 5.

In order to check the reliability, i.e., the acceptability, the transistors according to the first embodiment of the present invention were tested by employing them one at a time as the switching element for driving the known matrix type liquid crystal display unit, in a manner as shown in FIG. 5, with the source and gate voltage of the respective waveforms (a) and (b) of FIG. 6 applied to the source and gate electrodes 5 and 2. As a result thereof, as shown by a plotted curve $m_o$ shown in the graph of FIG. 11, 93% of the transistors tested could exhibit a stable performance without dielectric breakdown of the insulating layer 3 when 2800 hours elapsed.

Figure 7:
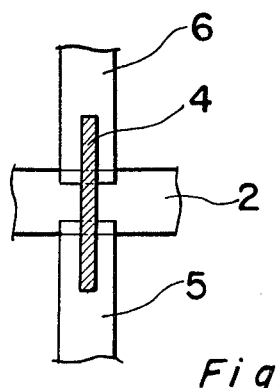
FIG. 7 is a schematic plan view of the prior art thin film transistor, showing an electrode arrangement.
Figure 11:
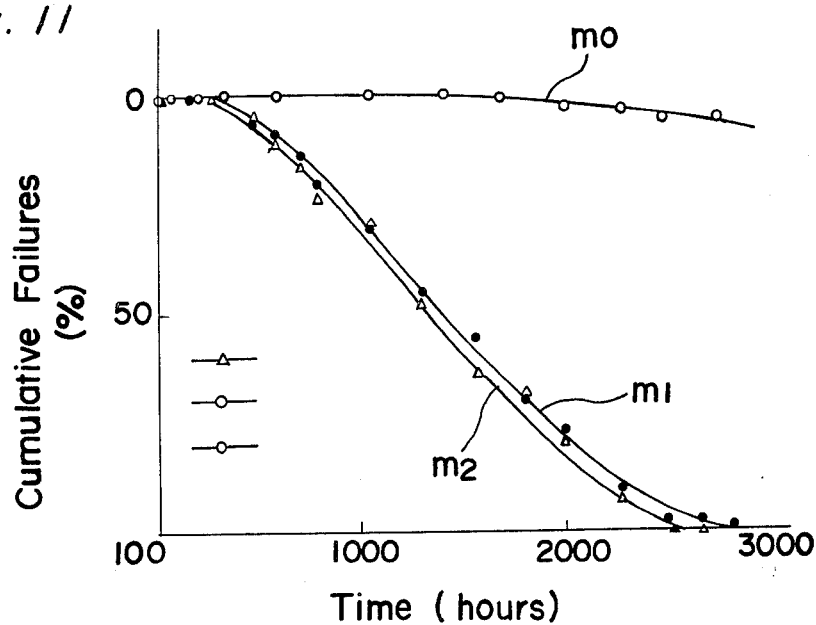
FIG. 11 is a graph showing the relationship of the cumulative failures versus time of the thin film transistors of respective construction shown in FIGS. 7, 8 and 9.

Prior art thin film transistors, each of which were identical in construction with those of the present invention, excluding the gap between the source and gate electrodes 5 and 2 as shown in FIG. 7, exhibited a ploted curve $m_1$ in the graph of FIG. 11 which accounts for the fact that only about 20% of the prior art thin film transistors could exhibit a stable performance when 2000 hours elapsed, and dielectric breakdown took place in all of them when 2600 hours elapsed.

Figure 9:
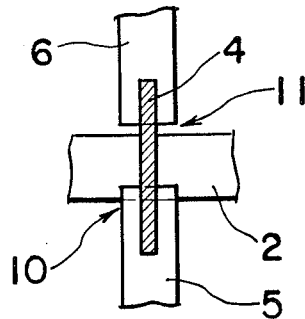
FIG. 9 is a view similar to FIG. 8, showing the drain electrode and the gate electrode spaced from each other.

The plotted curve $m_2$ shown in the graph of FIG. 11 illustrates the cumulative failure of thin film transistors each having a gap 11 between the drain and gate electrodes 6 and 2 while the source and gate electrodes 5 and 2 overlap at 10 with each other as shown in FIG. 9. This data was obtained by testing the respective TFT in the same manner as the transistors of the present invention were tested. From the curve $m_2$, it is clear that the percentage of the transistors that did not fail fell to 20 to 25% when 2000 hours elapsed, and to 0% when 2800 hours elapsed.

From the foregoing and also from the graph of FIG. 11, it is clear that as compared with the transistors having respective electrode arrangements shown in FIGS. 7 and 9, the transistor having the electrode arrangement shown in FIG. 8 is stable in performance for a prolonged period of time with no dielectric breakdown occurring in the insulating layer 3.

In particular, in the transistor having the electrode arrangement shown in FIG. 8, since the electrical resistance of a portion of the semiconductor layer 3 of the gap 8 is added as a parasitic resistance to the ON resistance of the transistor, there will be the possibility that, when the transistor is used as the above mentioned switching transistor, the resistance during the ON state will increase to such a value as to cause the ON-OFF ratio ($R_{OFF}/R_{ON}$: $R_{ON}$ and $R_{OFF}$ represent respectively the ON and OFF resistances of the transistor) of the transistor to be lower. However, the saturated drain current characteristic of the transistor having the electrode arrangement of FIG. 8 with respect to the applied gate voltage is such as shown by a curve $n_0$ in the graph of FIG. 12 while that of the transistor having the electrode arrangement of FIG. 7 and that of the transistor having the electrode arrangement of FIG. 9 are also shown by respective curves $n_1$ and $n_2$ in the graph of FIG. 12.

Figure 12:
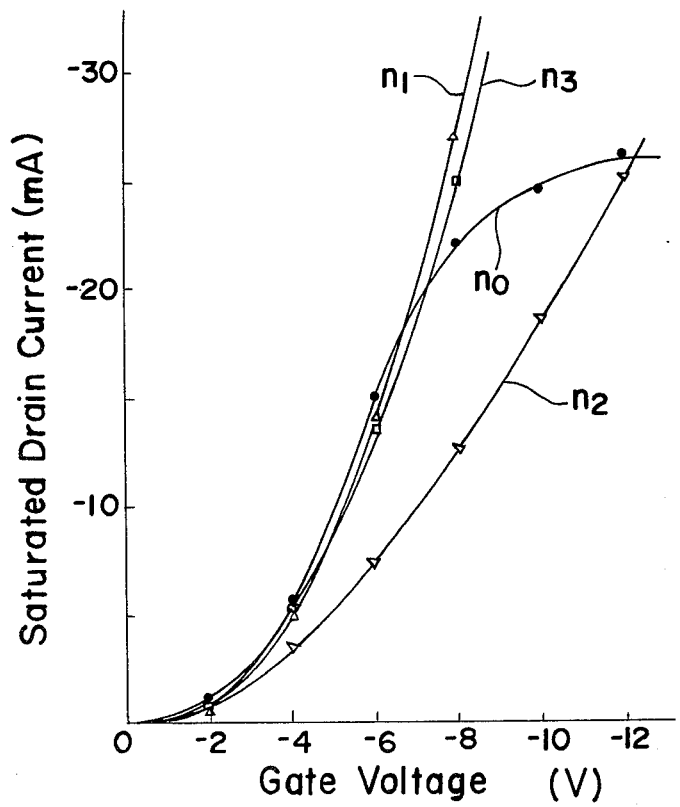
FIG. 12 is a graph showing the gate voltage dependence characteristic of the saturated drain current in the thin film transistors of respective construction shown in FIGS. 7, 8, 9 and 10.

As can be seen from FIG. 12, when $V_G \leq -8$, the saturated drain current characteristic of the transistor having the electrode arrangement of FIG. 8 is substantially equal to that of the transistor having the electrode arrangement of FIG. 7 and, therefore, reduction of the ON-OFF ratio of the transistor having the electrode arrangement of FIG. 8 is negligible.

To the contrary, in the transistor having the electrode arrangement of FIG. 9, as can readily be seen from the curve $n_2$ in the graph of FIG. 12 the saturated drain current is small with the reduced ON-OFF ratio as compared with any one of the transistors having the respective electrode arrangements of FIGS. 7 and 8.

In view of the foregoing, when the electrode arrangement of the transistor is constructed as shown in FIG. 8, the resultant transistor can exhibit a reliable performance for a prolonged period of time with no dielectric breakdown occurring in the insulating layer and also without reduction of the ON-OFF ratio.

Figure 10:
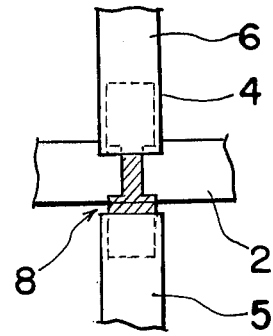
FIG. 10 is a view similar to FIG. 8, but according to a second embodiment of the present invention.

Referring now to FIG. 10 showing a second embodiment of the present invention, the thin film transistor shown therein is substantially identical in construction and material to that described in connection with the foregoing first embodiment of the present invention, except that any one of the source and drain electrodes 5 and 6 was $1000\mu$ in width, the space 8 between the source and gate electrodes 5 and 2 was $100\mu$ and the semiconductor layer 4 was $900\mu$ in width at portions adjacent the space 8 and in the vicinity of the source and drain electrodes 5 and 6.

The transistor having an electrode arrangement shown in FIG. 10 was satisfactorily operated for a prolonged period of time with no dielectric breakdown occurring in the insulating layer and exhibited a similar performance to that of the transistor having the electrode arrangement of FIG. 7. The saturated drain current characteristic of the transistor with the construction shown in FIG. 10 is shown by a curve $n_3$ in FIG. 12, which is closely similar to the curve $n_1$. Accordingly, the ON-OFF ratio of the transistor having the electrode arrangement of FIG. 10 is substantially similar to that shown by the curve $n_1$ even at $|V_G|>8$.

It is to be noted that, a similar description applies even where the gate electrode 2 is formed of Ta, Hf, Nb, Mo or Au, where the gate insulating layer 3 is formed by anodizing the material for the gate electrode or formed of SiO, $SiO_2$, $Al_2O_3$ or $Si_3N_4$ by the use of any known chemical vapor deposition technique or any known vacuum deposition technique, or any known sputtering technique, where the source and drain electrodes 5 and 6 are each formed of Al, In, Ni or Mo, and/or where the semiconductor layer 4 is formed of CdSe, CdS or PbS.

Figure 14:
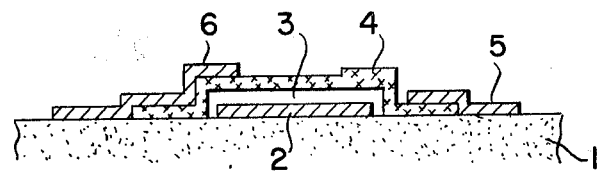
FIG. 14 is a sectional view of a thin film transistor representing a third embodiment of the present invention.

Although the present invention has fully been described in connection with the preferred embodiments thereof, various changes and modifications may be obvious to those skilled in the art. By way of example, in the second embodiment of the present invention, instead of employing the semiconductor layer 4 wherein those portions thereof adjacent the space 8 and in the vicinity of the source and drain electrodes 5 and 6 are made larger in width than the remaining portion (channel area) thereof, the semiconductor layer 4 may have that portion either having a larger thickness (FIG. 14) than the remaining portion or having a higher concentration of impurities, thereby avoiding any possible adverse effect the parasitic resistance may bring about.

Such changes and modifications are to be construed as included within the scope of the present invention.

What is claimed is:

1. A thin film transistor comprising in combination a substrate having source and drain electrodes formed thereon, a semiconductor layer making contact in part with said source electrode and in part with said drain electrode, a gate electrode, and a gate insulating layer positioned between said semiconductor layer and said gate electrode, said semiconductor layer interpositioned between said substrate and said drain and source electrodes and overlying said gate electrode wherein said drain electrode is held in an overlapping relationship above a portion of a first edge of said gate electrode and said source electrode is spaced apart laterally from a second edge of said gate electrode so as not to overlap said gate electrode, such that the resulting transistor will exhibit a reliable performance for a prolonged period of time without dielectric breakdown occurring in said insulating layer or reduction in the ON-OFF ratio.

2. A transistor as claimed in claim 1, wherein portions of said semiconductor layer adjacent said space between said source electrode and said gate electrode and where contacting said source and drain electrodes has a width larger than the remaining portion of said semiconductor layer connecting said drain and source electrodes.

3. A transistor as claimed in claim 1, wherein those portions of said semiconductor layer adjacent said space between said source electrode and said gate electrode has a thickness larger than the remaining portion of said semiconductor layer connecting said drain and source electrodes.

4. A transistor as claimed in claim 1, wherein those portions of said semiconductor layer adjacent said space between said source electrode and said gate electrode has a higher concentration of impurities than the remaining portion of said semiconductor layer connecting said source and drain electrodes.

* * * * *